April 16, 1968 R. E. HOBBS 3,377,697

METHOD OF TERMINATING THIN FILM COMPONENTS

Filed Oct. 15, 1965

United States Patent Office 3,377,697

Patented Apr. 16, 1968

3,377,697
METHOD OF TERMINATING THIN FILM COMPONENTS

Richard Ernest Hobbs, Chingford, London, England, assignor to Associated Electrical Industries Limited, London, England, a British company Filed Oct. 15, 1965, Ser. No. 496,459
Claims priority, application Great Britain, Oct. 23, 1964, 43,267/64
15 Claims. (Cl. 29—621)

This invention relates to improvements in tantalum thin film components, and is applicable both to thin film resistors and to thin film capacitors as specific components and to such resistors and/or capacitors utilised in thin film integrated circuits.

A tantalum thin film device inevitably includes a substrate of insulating or semi-conducting material on which is deposited a thin film of tantalum. The device will require terminating contacts to which external leads can be soldered, thermocompression bonded or welded. It is important that these contacts are electrically stable, and that the contacts should adhere strongly to the tantalum film, and the substrate, and that the external leads shall similarly adhere strongly to the contacts.

However, on the surface of a tantalum film a thin layer of oxide tends to form on exposure to oxidising ambients, such as the atmosphere. Further, a tantalum thin film resistor usually will be annealed in air after deposition, and this further increases the quantity of oxide present. The deposition of contact metal onto tantalum which has been oxidised by exposure to the atmosphere, or heated under oxidising conditions, results in a contact region which is likely to have a relatively high resistance, which is likely to suffer from an increase in resistance in use, which is likely to be chemically and physically unstable, and which is likely to provide poor adhesion between the contact metal and the tantalum.

An object of the present invention is the provision of an improved method of providing a tantalum thin film device with a secure contact region of relatively low resistance.

According to the present invention, a method of providing a component including a thin film of tantalum on a substrate with a contact area for the attachment of external leads comprises providing a firmly adherent chromium film over a first area of the substrate including and greater than the desired contact area, providing on the chromium film a firmly adherent gold film extending over a second area including and greater than the desired contact area but lesser in area than and lying completely within the area of the chromium film, covering the part of the gold film which is to form the desired contact area with a film of nickel, coating a selected surface area of the substrate, including the exposed parts of the first and second areas and of the nickel with a thin tantalum film, and removing the nickel film and thus the overlying tantalum film to expose the desired contact area as an area of uncontaminated gold film.

The invention will now be described, by way of example, with reference to the accompanying diagrammatic drawings, in which.

Figure 1:
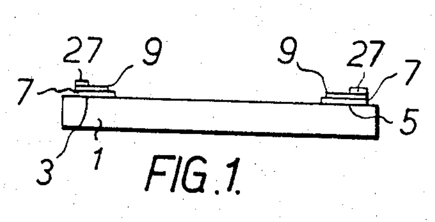
FIGURE 1 is a front elevation of a thin film resistor at one stage in its manufacture.
Figure 5:
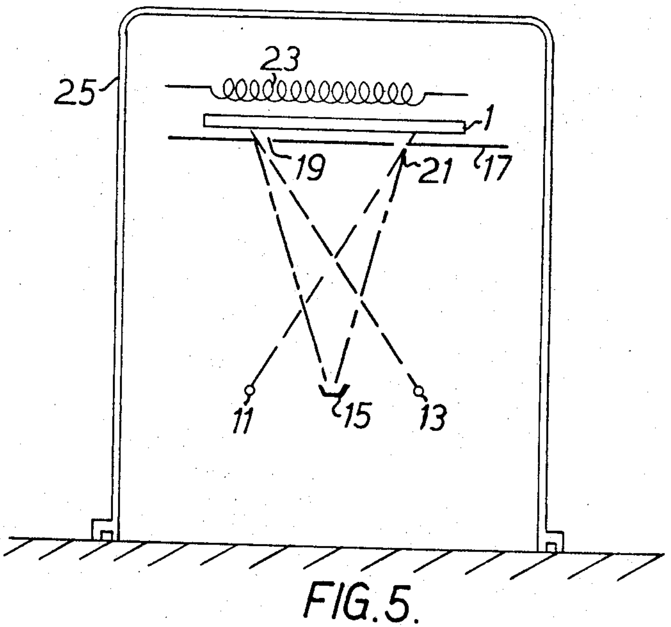
FIGURE 5 is a diagrammatic representation, not to scale, of apparatus used in the manufacture of the resistor.

Referring first to FIGURE 1, a substrate 1 of glass or suitable ceramic material is first provided over each of two contact regions 3 and 5 with a film 7 of chromium and a superimposed film 9 of gold. It is important that the film 7 extends beyond the film 9 as shown. The apparatus used for this deposition is illustrated in FIGURE 5, in which the substrate 1 is shown arranged horizontally with the desired deposition regions underneath. Two chromium evaporation sources 11 and 13 are in the form of tungsten wires each 3 cms. long and 1 mm. in diameter; these wires being arranged horizontally parallel to one another and at a spacing of 6 cms. The distance between these wires and the substrate is 15 cms. Each tungsten wire is coated with powdered chromium. Between the two wires, and parallel to them, is a gold deposition source 15 in the form of a molybdenum boat containing gold, its dimensions being approximately 1 cm. by 0.5 cm. by 0.3 cm. Facing these three sources, and parallel to the substrate 1 at a spacing of about 0.2 mm. from the substrate, is a thin molybdenum mask 17 in which are formed two apertures 19 and 21 corresponding respectively to the two desired contact areas. It will be seen from FIGURE 5 that the two chromium sources 11 and 13 together view through each of the apertures 19 and 21 a greater area of the substrate than does the gold source 15. A heater 23 is disposed above the substrate 1, and the components shown are disposed in an envelope 25 (which is a purely diagrammatic representation of the large envelope actually used), which is evacuated to a pressure not greater than $5\times10^{-5}$ torr.

In use of the apparatus shown in FIGURE 5, the two sources 11 and 13 are electrically heated and atomic particles of chromium are transferred from the tungsten wires to the substrate 1. Since these particles travel in straight lines, the areas of deposition are determined by the locations of the sources and the apertures in the mask 17. During this deposition, the temperature of the substrate is raised by the heater 23 to not less than 250° C.; 300° C. has been found to be a convenient processing temperature. Just before evaporation of the chromium is completed, the boat 15 is heated to cause a transfer of gold onto the deposited chromium. Thus between the films 7 and 9 there exists an alloy of gold-chromium. It will be seen from FIGURE 1 that the film of gold so deposited will be smaller in area than the film of chromium. It is important that along any edge which will eventually contact the resistor track to be formed on the substrate, the chromium film shall project very slightly beyond the gold layer. Any excess gold film, overlapping the edge of the chromium film, would eventually diffuse into the tantalum, leaving a void and causing a consequent loss of adhesion of the tantalum (see below) to the substrate.

Figures 2, 4:
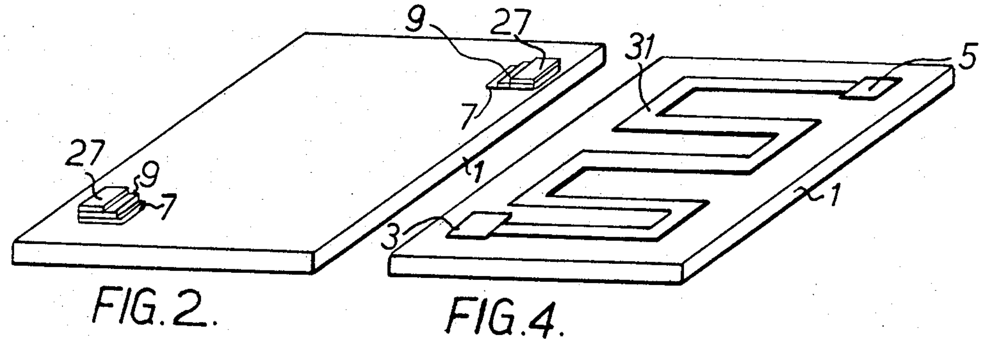
FIGURE 2 is a perspective drawing of the resistor at the stage shown in FIGURE 1.
FIGURE 4 is a representation of a desired form of resistor track.

The mask 17 is then replaced with a molybdenum mask in contact wtih the substrate and having different apertures such that, when the chromium and gold sources are replaced with an appropriate nickel source, such as a single coiled tungsten filament source containing strips of nickel, in a second evaporation process, carried out with the substrate unheated, the nickel is melted and then evaporated and deposited as a film 27 over those parts of the gold film which will be required for the attachment of the leads referred to above. FIGURE 2 is a perspective drawing of the substrate as it appears at this stage, the thicknesses of the films 7, 9 and 27 being exaggerated.

Figure 3:
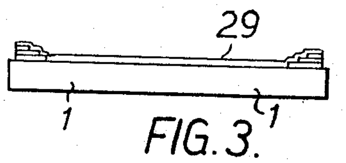
FIGURE 3 is a front elevation of the resistor at a further stage in its manufacture.

The substrate, carrying the deposited films 7, 9 and 27, is then provided with a thin film 29 of tantalum approximately 1000 A. thick by cathodic ion bombardment (i.e. sputtering) or by electron beam evaporation of a tantalum source. Film 29 can have a thickness lying in the range 500 A. to 4500 A. During this process the temperature of the substrate must not be below 250° centigrade, since otherwise poor adhesion of the tantalum to the chromium edges will occur and subsequently will result in an open circuit in the finished resistor. During deposition of the tantalum, gold from the parts of film 9 which are uncovered by the film 27 diffuses into the tantalum. This produces the arrangement shown in FIGURE 3.

The desired resistor track 31 (see FIGURE 4) is defined on the tantalum film 29 by a photo-resist method. Thus a layer of a photo-resist known as Kodak K.P.R., which is a plastics material sensitised to harden on the exposure of the material to ultraviolet light, is formed over the tantalum film. Using a photographic mask, the part of the tantalum film which is to be used for the resistor track 31 and the contact regions are exposed to ultraviolet light, so that the plastics material overlying the track 31 is hardened. The surface is now treated with an etchant consisting of a mixture of hydrofluoric acid, nitric acid and acetic acid, which etchant first removes the unhardened parts of the plastics film and then etches away the exposed parts of the tantalum film 29.

Figure 6:
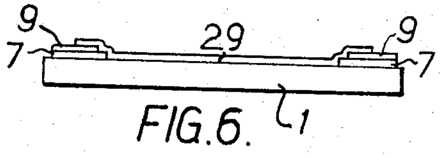
FIGURE 6 is a front elevation of the finished resistor, ready for the attachment of flying leads.

The hardened photo-resist is then removed by the use of suitable solvents, and the substrate is immersed in dilute nitric acid or in ferric chloride solution so as to dissolve the nickel films 27. The assembly now has the appearance shown in FIGURE 6, the parts of the gold films 9 which were covered with the nickel films 27 now being exposed and being free from contamination ready for the securement thereto to the desired electrical leads. These leads (not shown) are secured to those gold parts by soldering or by welding.

By use of the process of manufacture described above, it has been found possible to prepare contacts (the gold plated areas) which are bonded firmly to the glass or ceramic substrate, which are of low electrical resistance and are chemically and physically stable when in contact with a thin film of tantalum.

The contacts can be used with the following substrates besides ceramics and glass, and as listed below.

*List* (*a*).—Metals with an oxide coating such as aluminium, titanium, tantalum, tungsten where the oxide is formed by thermal treatment of the metal or by anodising its surface.

*List* (*b*).—Oxide coated semiconductors such as silicon where the oxide is formed by thermal treatment or by anodising.

*List* (*c*).—Metals, non-metals, semiconductors and plastics, capable of withstanding processing temperatures, coated with aluminium oxides, silicon oxides, titanium oxides, tantalum oxides, tungsten oxides, tin oxides, glass and ceramics, where compatability of thermal expansions allow, deposited by evaporation, sputtering or chemical means.

The invention also includes thin film tantalum components produced by the method disclosed and integrated circuits incorporating thin film tantalum components produced by that method.

What I claim is:

1. A method for providing an electric component including a thin film of tantalum on a substrate, with a contact area for the attachment of external leads, comprising:
   (a) providing a firmly adherent chromium film over a first area of the substrate including and greater than the desired contact area,
   (b) providing on the chromium film a firmly adherent gold film extending over a second area including and greater than the desired contact area but lesser in area and lying completely within the area of the chromium film,
   (c) covering that part of the gold film which is to form the desired contact area with a film of nickel,
   (d) coating a selected surface area of the substrate including the exposed parts of the first and second areas and of the nickel with a thin tantalum film, and
   (e) removing the nickel film and thus the overlying tantalum film to expose the desired contact area as an area of uncontaminated gold film.

2. A method according to claim 1, wherein the area of uncontaminated gold film is exposed by bringing the region of the substrate including that area into contact with a selective etching reagent effective to remove only the nickel and the overlying tantalum film.

3. A method according to claim 2, wherein the etching reagent is nitric acid.

4. A method according to claim 2, wherein the etching reagent is ferric chloride.

5. A method according to claim 1, wherein the chromium film is deposited with the substrate at a temperature of at least 250° C. and the substrate is of a material capable of resisting this temperature.

6. A method according to claim 5, wherein any of the metal films on the substrate are produced in an evacuated enclosure by evaporating a source of the metal onto the substrate.

7. A method according to claim 6, wherein at least one of the metal films is evaporated onto the substrate through an aperture provided in a masking member disposed between the metal source and the substrate and profiled to limit the film deposited to the desired area.

8. A method according to claim 7, wherein two contiguous films of different metal are evaporated in sequence through the same aperture in the masking member, by so arranging the sources of the metals with respect to the aperture that each of the films is deposited over the desired area.

9. A method according to claim 8, wherein the chromium and the gold films are deposited in sequence through the same aperture.

10. A method according to claim 1, wherein the tantalum film is deposited with the substrate at a temperature of at least 250° C. and the substrate is of a material capable of resisting this temperature.

11. A method according to claim 10, wherein the tantalum film is deposited over a selected area of the substrate so as to provide a tantalum film configuration which is suitable for the function of component.

12. A method according to claim 1, wherein the tantalum film initially is deposited over substantially the whole of that region of the substrate which includes the contact areas and subsequently is selectively removed from all but the selected area.

13. A method according to claim 2, wherein the tantalum film is selectively removed from the substrate by a photo-resist method.

14. A method according to claim 10, wherein the tantalum film is deposited to a thickness within the range 500° A. to 4500° A.

15. A method according to claim 1, wherein the surface of the substrate on which said chromium film is provided is selected from the group consisting of glass, ceramic, silicon oxides, and metal oxides.

References Cited

UNITED STATES PATENTS

| | | | |
|---|---|---|---|
| 1,857,929 | 5/1932 | McFarland. | |
| 3,100,723 | 8/1963 | Weed | 117—107 X |
| 3,167,451 | 1/1965 | Tierman | 338—308 X |
| 3,253,320 | 5/1966 | Levi-Lamond | 117—212 X |
| 3,296,574 | 1/1967 | Tassara | 338—309 |
| 3,322,655 | 5/1967 | Garibotti et al. | |
| 3,326,718 | 6/1967 | Dill | 117—107 X |

JOHN F. CAMPBELL, *Primary Examiner.*

J. L. CLINE, *Assistant Examiner.*